(12) United States Patent
Wirt

(10) Patent No.: US 8,326,551 B2
(45) Date of Patent: Dec. 4, 2012

(54) METHOD AND SYSTEM FOR INCORPORATING ELECTRONIC SIGNATURE ANALYSIS IN LOW VOLTAGE POWER SUPPLIES

(75) Inventor: Randall Brian Wirt, Penfield, NY (US)

(73) Assignee: Xerox Corporation, Norwalk, CT (US)

( * ) Notice: Subject to any disclaimer, the term of this patent is extended or adjusted under 35 U.S.C. 154(b) by 167 days.

(21) Appl. No.: 12/107,362

(22) Filed: Apr. 22, 2008

(65) Prior Publication Data

US 2009/0261855 A1 Oct. 22, 2009

(51) Int. Cl.
*G01R 31/00* (2006.01)

(52) U.S. Cl. ............... 702/58; 702/33; 702/34; 702/35; 702/36; 702/57; 702/64; 702/65; 702/71; 702/81; 702/82; 324/511; 324/522; 324/523; 324/524

(58) Field of Classification Search ............ 702/33, 702/34, 35, 36, 57, 58, 64, 65, 71, 81, 82; 324/511, 522, 523, 524

See application file for complete search history.

(56) References Cited

U.S. PATENT DOCUMENTS

| | | | | |
|---|---|---|---|---|
| 4,399,513 A | * | 8/1983 | Sullivan et al. | 702/182 |
| 4,858,141 A | * | 8/1989 | Hart et al. | 702/61 |
| 4,918,390 A | * | 4/1990 | Ziv et al. | 324/415 |
| 5,363,039 A | * | 11/1994 | Kumar et al. | 324/158.1 |
| 5,493,211 A | * | 2/1996 | Baker | 324/130 |
| 6,268,733 B1 | | 7/2001 | Abbata et al. | 324/511 |
| 6,977,494 B2 | * | 12/2005 | Ramirez | 324/117 R |
| 7,197,429 B2 | * | 3/2007 | Rosa | 702/183 |
| 7,363,186 B1 | * | 4/2008 | Costello et al. | 702/107 |
| 2004/0133378 A1 | * | 7/2004 | Todd et al. | 702/115 |
| 2005/0057869 A1 | * | 3/2005 | Hale et al. | 361/64 |
| 2007/0057720 A1 | * | 3/2007 | Hand et al. | 330/10 |
| 2007/0236242 A1 | * | 10/2007 | Varadarajan et al. | 324/769 |

* cited by examiner

*Primary Examiner* — Jonathan C Teixeira Moffat
*Assistant Examiner* — Hyun Park
(74) *Attorney, Agent, or Firm* — Luis M. Ortiz; Kermit D. Lopez; Tuesday A. Kaasch

(57) ABSTRACT

A method and system for incorporating electronic signature analysis in a low voltage power supply to centrally monitor current consumption is disclosed. The electrical loads powered by the low voltage power supply can be tested individually via an automatic test routine by measuring and scaling of current through a differential amplifier. The current consumption of each electrical load can be measured by analyzing a "delta" in the current draw of each electrical load's ON and OFF condition. This value can be compared against a stored table of high and low limits for each electrical load. If a load's current is outside the limits, it will be logged for repairs. A current sensing device can be inserted in series with the output(s) of the low voltage power supply, while in test mode, to allow the automatic test routine to run, and then be shorted out for normal operation.

18 Claims, 3 Drawing Sheets

METHOD AND SYSTEM FOR INCORPORATING ELECTRONIC SIGNATURE ANALYSIS IN LOW VOLTAGE POWER SUPPLIES

TECHNICAL FIELD

Embodiments are generally related to a Low Voltage Power Supply (LVPS). Embodiments are also related to current analysis of any electrical load powered by a LVPS. Embodiments are further related to electronic signature analysis.

BACKGROUND OF THE INVENTION

Electronic signature analysis is generally a procedure for acquiring current and voltage signals, performing signal conditioning and analyzing the derived signals to identify various faults. Electronic signature analysis is a versatile and powerful, yet truly non-intrusive technology that can be readily integrated into most electromechanical equipment to greatly enhance condition diagnostics and prognostics capabilities. Electronic signature analysis provides diagnostic and prognostic information and requires only access to electrical lines carrying input or output power rather than to the equipment itself. Thus, either onboard or remote analysis is possible even if continuous monitoring if desired. Such an analysis approach has already been tested on and successfully applied to a wide variety of systems, including military, industrial, and consumer equipment.

The majority of prior art current analysis techniques possess limited capabilities in providing a cost effective solution. A current sensing device (e.g., resistor, current transformer, etc.) is required to be placed at each of the electrical loads (e.g., motors, solenoids, blowers, heaters, sensors, etc.) to be monitored in a particular machine module. Such an approach is very costly due to the extra circuitry and board space needed to accommodate the circuitry, as well as an increased number of I/O lines to a microprocessor to read the information. Similarly, faulty wire harnesses and unplugged components associated with the machine module cannot be detected automatically. Hence, preordering of faulty parts is not possible if the machine module does not possess a diagnosing capability for its own electrical problems.

Based on the foregoing, it is believed that a need exists for an improved method and system for incorporating electronic signature analysis in low voltage power supplies and for providing a cost effective solution by reducing the extra circuitry as well as the number of I/O lines to the microprocessor.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved method and system for incorporating electronic signature analysis in low voltage power supplies.

It is another aspect of the present invention to provide for an improved method and system for monitoring current centrally in a low voltage power supply (LVPS).

It is a further aspect of the present invention to provide for an improved method and system for automatically diagnosing electrical problems in an electromechanical system.

The aforementioned aspects and other objectives and advantages can now be achieved as described herein. A method and system for incorporating electronic signature analysis in low voltage power supplies in order to monitor current centrally is disclosed herein. The electrical loads powered by the LVPS can be tested individually via an automatic test routine by measuring and scaling of current through a differential amplifier. The current consumption of each electrical load can be measured by analyzing a delta in current draw with respect to the ON and OFF condition of each electrical load. This value can be compared against a stored NVM (Non-Volatile Memory) table of "high" and "low" limits for each electrical load. If a load's current draw is determined to be outside the limits, it is logged for an appropriate user in order to make repairs. A precision resistor (or other current sensing device) can be inserted in series with the output of the LVPS to make current measurements while in an automatic test mode and then the current sensing device can be shorted during a normal operation mode.

A Module Control Board associated with the LVPS divides the voltage signal obtained from the differential amplifier within the LVPS to a signal (e.g., 0-5 V signal) for an A/D converter (e.g., 5 V A/D converter). The Module Control Board can then be utilized to short out the precision resistor (or other current sensing device) for normal operation mode by altering the states of one or more input parameters associated with the LVPS when the testing is complete. The LVPS monitors current centrally immediately before the current splits to exit several external connectors that connect electrically with various circuit boards and electrical loads in a machine module. The electrical load in a machine module can constitute a "current" tested via the automatic test routine, and this method can also automatically detect unplugged and faulty wire harnesses associated with these loads. Such an approach incorporates the machine module with a smart diagnosing capability to diagnose electrical problems.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
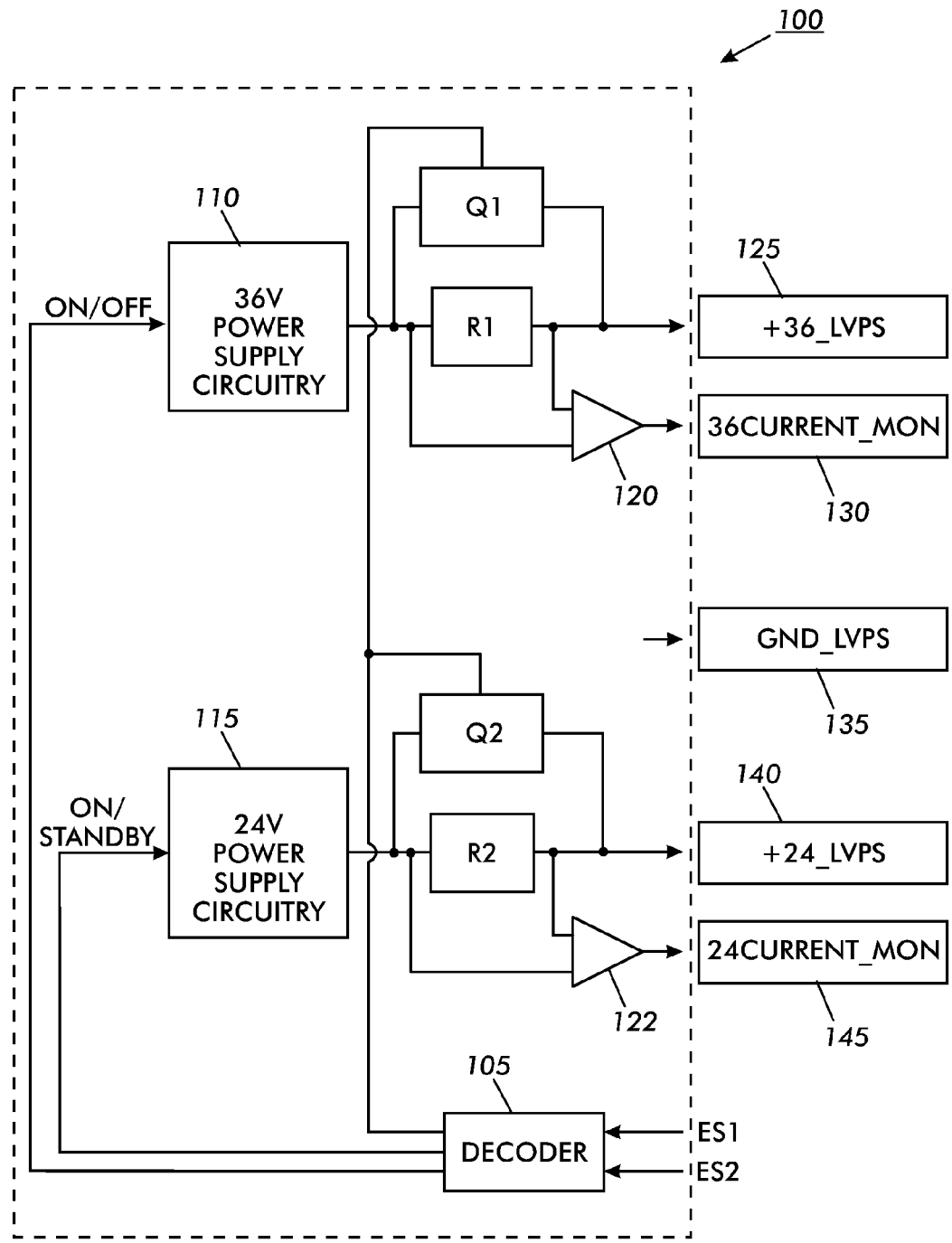
FIG. 1 illustrates a schematic diagram of a LVPS that incorporates electronic signature analysis, which can be implemented in accordance with a preferred embodiment.

Referring to FIG. 1, a schematic diagram of a low voltage power supply (LVPS) 100 that incorporates electronic signature analysis is illustrated, in accordance with a preferred embodiment. Load and speed variations, wear and tear, faulty connectors and wiring, and aging electrical components in electromechanical systems generally produce correlated variations in current. Electronic signature analysis analyzes these currents and verifies that they are within specifications for a "healthy" machine. The resulting current signatures reflect loads, stresses, and wear throughout the system and allow an extensive range of electromechanical diagnostic information to be obtained from one central source. Electronic signature analysis diagnostic components can be utilized to pinpoint electrical and/or mechanical problems and target maintenance on an as-needed basis, thereby increasing equipment reliability and maintenance efficiency and minimizing unexpected downtime.

In the example configuration depicted in FIG. 1, LVPS 100 generally includes a power supply circuit 110 (e.g., 36V) or additional power supply circuits 115 (e.g., 24V) that can function as the power supply circuitry. Small precision resistors R1 and R2 (e.g., 0.1 ohm) can be inserted in series with the outputs of 110 and 115 in the LVPS 100. Differential amplifiers 120 and 122, measure the voltage drop across R1 and R2 which are used to calculate current. The LVPS 100 can further include a power FET (field effect transistor) Q1 and a power FET Q2 for shorting out the precision sense resistors R1 and R2 to restore the LVPS to normal operation mode. Operating mode control signals ES1 and ES2 can be decoded 105 and provide a drive signal to FET Q1 and FET Q2.

The precision resistors R1 and R2 generally possess a predetermined resistance and can be configured from materials having low temperature and voltage coefficients as desired to accommodate the precision needed in manufacturing analog circuits. The differential amplifiers 120 and 122 measure and scale the current into a 0-20V signal that is electronically transmitted to a Module Control Board 205 for measurement. The Module Control Board 205 can turn on and off each of the various electrical loads 210 contained in the machine module 200. The operating parameters of the Module Control Board 205 and NVM (non-volatile memory) Table 250 can be altered via a software load program. The 0-20V signal would represent, for example, 0-3 A with 6 mA resolution in some embodiments. The 0-20V signal can be divided back down, for example, to a 0-5V signal with respect to the Module Control Board 205 for a 5V A/D converter (not shown) for converting analog to digital signals.

LVPS 100 also includes two operating mode selection input parameters ES1 and ES2 that are controlled by the Module Control Board 205. A decoder 105 decodes the input parameters ES1 & ES2 from the Module Control Board 205 via diodes (not shown). A +36_LVPS 125 and a +24_LVPS 140 can constitute, for example, the two positive voltage terminals of the LVPS 100. A GND LVPS 135 indicates the ground terminal of the LVPS 100. A 24CURRENT_MON 145 and a 36CURRENT_MON 130 can function as the outputs terminals from the differential amplifiers 120 and 122 respectively. Electrical power supplies in a narrow sense are actually converters from one voltage/current combination to another with only small power losses. In a special test mode, the LVPS 100 can test each electrical load 210 associated with the LVPS 100 as directed by the Module Control Board 205.

Figure 2:
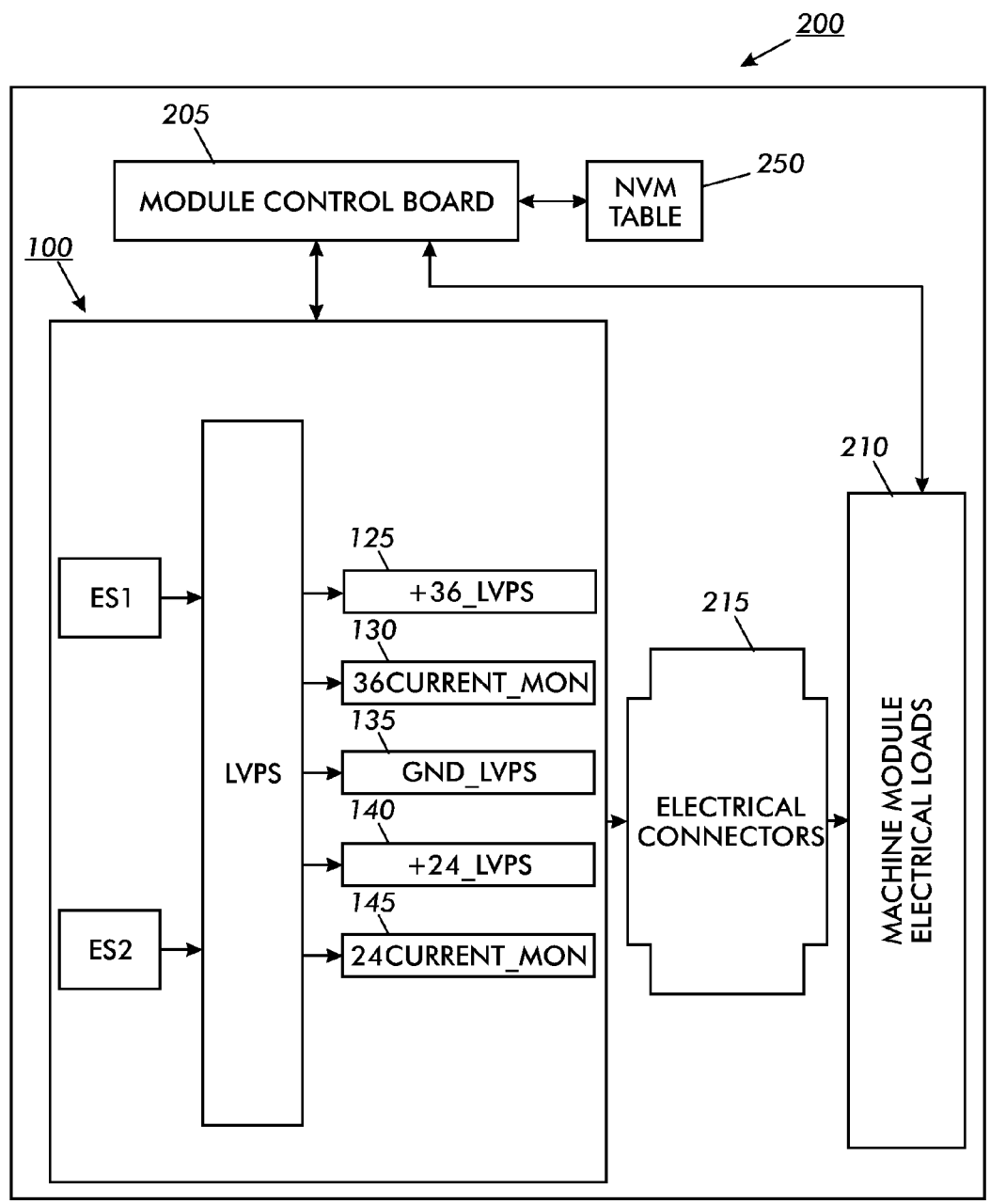
FIG. 2 illustrates a block diagram of a machine module with a LVPS that incorporates electronic signature analysis, in accordance with a preferred embodiment.

Referring to FIG. 2, a block diagram of a machine module 200 with a LVPS 100 incorporating electronic signature analysis is illustrated, in accordance with a preferred embodiment. The input parameters ES1 and ES2, and terminals 125, 130, 135, 140, and 145 from the LVPS 100 can be connected to the Module Control Board 205. The terminals 135, 125, and 140 of the LVPS 100 can be connected to the electrical connectors 215. The connectors 215 connect the output terminals to various electrical loads 210 or circuit boards (not shown) associated with a machine module 200. LVPS 100 incorporates electronic signature analysis which monitors current centrally. The default state of the input parameters ES1 & ES2 from the Module Control Board 205 can be set to "1". Such a setting generally places the LVPS 100 in a special test mode, which turns off FET Q1 and Q2 which allows each electrical load 210 to be tested individually. The electrical loads 210 powered by the LVPS 100 can be tested individually via the automatic test routine by measuring and scaling current through the differential amplifiers 120 and 122. The output of the differential amplifiers 120 and 122 can be, for example, a 24CURRENT_MON 145 and a 36CURRENT_MON 130.

The current consumption of each electrical load 210 associated with the machine module 200 can be measured by examining a particular delta in current draw with respect to each load's "on" and "off" condition. This value can be compared against a stored NVM (Non-Volatile Memory) table 250 of "high" and "low" limits for each electrical load 210. The NVM table 250 can be stored in an NVM memory, which may be, for example, a RAM device that will store or retain information so long as a DC voltage is applied or a true NVM memory device that will store or retain information when DC voltage is removed. If an electrical load 210 is found to be outside these limits, it will be logged for follow up by an appropriate user to make repairs. Precision resistors such as R1 and R2 depicted in FIG. 1 can be inserted in series with the outputs 110 and 115 of the LVPS 100 to allow current measurements in a special test mode. When testing is complete, the Module Control Board 205 can set the input parameters ES2=1 & ES1=0 to turn on FET Q1 and Q2 which will short out the precision resistors R1 and R2 for normal operation mode, The LVPS 100 centrally monitors the current immediately before the current splits to exit several external connectors 215 that pass to various electrical loads 210 and/or other circuit boards (not shown) that drive other electrical loads in the machine module 200.

Figure 3:
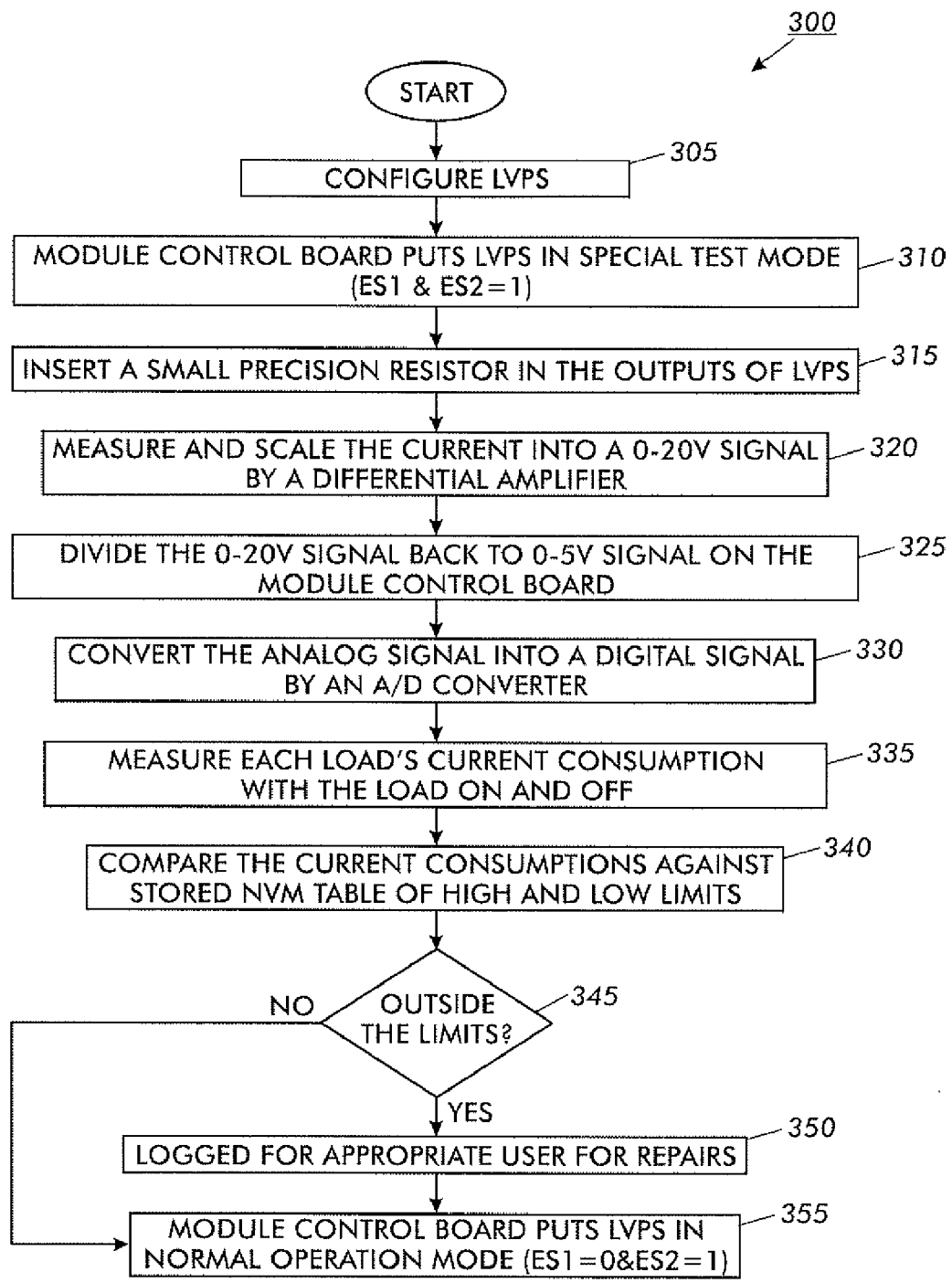
FIG. 3 illustrates a high level flow chart of operations illustrating logical operational steps of a method for incorporating electronic signature analysis in a LVPS, in accordance with a preferred embodiment.

Referring to FIG. 3, a high level flow chart of operations depicting logical operational steps of a method 300 for signature analysis in LVPS 100 is illustrated, in accordance with a preferred embodiment. The LVPS 100 can be provided, as depicted at block 305. Thereafter, as indicated at block 310, LVPS 100 can be placed in a special test mode by the Module Control Board 205 assigning ES1 & ES2=1. Small precision resistors R1 & R2 can be inserted in series with the outputs of the LVPS 100 when FET Q1 and Q2 turn off, as depicted at block 315. Thereafter, as described at block 320, the current can be measured and scaled into a 0-20V signal by differential amplifiers 120 and 122. The 0-20V signal can be electrically transmitted to the Module Control Board 205 for measurement. The 0-20V signals can be then divided back to a 0-5V signal with respect to the Module Control Board 205, as depicted at block 325.

Thereafter as depicted at block 330, the analog signal can be converted into a digital signal by an AD converter. Each electrical load's current consumption can be measured with the load ON and OFF, as depicted at block 335. The current consumption can be compared to data contained in the stored NVM table 250 of "high" and "low" limits, as depicted at block 340. A determination can be then made whether or not the current consumption is outside the limits, as depicted at block 345. If the current consumption is outside the limits, this can be logged for appropriate repair by a user, as depicted at block 350. Otherwise, the LVPS 100 can be placed into a normal operation mode from the Module Control Board 205 by assigning ES1=0 and ES2=1, as depicted at block 355.

It is believed that by utilizing the method 300 and LVPS 100 configuration described herein, the cost and extra board space to accommodate the additional electrical components at each load 210 or circuit boards (not shown) associated with a machine module 200, needed to perform signature analysis at each electrical load 210, can be minimized by centrally locating the signature analysis circuitry within the LVPS 100 to be shared by all loads. Further, service calls can be shortened and faulty parts can be preordered. The method described herein also can be adapted for automatic detection of faulty wire harnesses and unplugged electrical loads 210 or connectors 215.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for incorporating electronic signature analysis in a low voltage power supply, comprising:
    scaling a current into a voltage signal with a range of 0-20V via said low voltage power supply utilizing at least one differential amplifier electrically in communication with said low voltage power supply;
    controlling a plurality of input parameters of said low voltage power supply utilizing a said module control board;
    decoding said plurality of input parameters utilizing a decoder;
    placing said low voltage power supply in a test mode by setting said plurality of input parameters equal to a predetermined value in order to turn OFF a plurality of field effect transistors (FETs) utilizing said module control board;
    dividing said voltage signal into signals with a range of 0-5V utilizing said module control board;
    utilizing said low voltage power supply in said test mode to centrally measure an individual current consumption for each electrical load among a plurality of electrical loads associated with a machine module;
    providing a predetermined range of high and low current consumption limits for each of said plurality of electrical loads stored as a Non-Volatile Memory (NVM) table;
    comparing said individual current consumption against said predetermined range of high and low current consumption limits for said electrical load to determine if said current consumption falls outside of said predetermined range of high and low current consumption limits for said electrical load in order to identify at least one electrical load among said plurality of loads requiring a subsequent repair; and
    inserting a plurality of precision resistors in series with at least one output of said low voltage power supply such that when said plurality of field effect transistors are turned ON said plurality of precision resistors are shorted in order to place the machine module into a normal operation mode.

2. The method of claim 1 further comprising:
    initially measuring and scaling a current into a voltage signal utilizing an automatic test routine running on a control board of said machine module associated with said low voltage power supply in order to utilize said low voltage power supply to centrally measure and determine said individual current consumption of said electrical load.

3. The method of claim 2 further comprising transmitting said voltage signal to said control board of said machine module for a measurement thereof.

4. The method of claim 3 further comprising:
    shifting said low voltage power supply between said test mode and said normal operation mode by changing a state of at least one of said input parameters associated with said low voltage power supply utilizing said control board of said machine module.

5. The method of claim 3 further comprising:
    Inserting a current sensing device in series with at least one output of said low voltage power supply in order to shift said low voltage power supply between said test mode and a normal operation mode by changing a state of at least one input parameter associated with said low voltage power supply utilizing said control board of said machine module.

6. The method of claim 5 wherein said low voltage power supply incorporates said electronic signature analysis to diagnose at least one electrical problem associated with said at least one electrical load associated with said machine module.

7. The method of claim 1 further comprising utilizing an electronic signature analysis with respect to said low voltage power supply to monitor current centrally prior to splitting and exiting said current from said low voltage power supply and electrically transmitted said current to a plurality of external connectors associated with said plurality of electrical loads within said machine module.

8. The method of claim 1 wherein said low voltage power supply automatically detects an unplugged and/or a faulty wire harness associated with said plurality of electrical loads.

9. A method for incorporating electronic signature analysis in a low voltage power supply, comprising:
    controlling a plurality of input parameters of said low voltage power supply utilizing a module control board of a machine module associated with said low voltage power supply;
    decoding said plurality of input parameters utilizing a decoder;
    initially measuring and scaling a current into a voltage signal utilizing an automatic test routine, determined by said input parameters, running on said control board, wherein during said automatic test routine a plurality of field effect transistors (FETs) are turned OFF;
    dividing said voltage signal into signals with a range of 0-5V utilizing said module control board;
    utilizing said low voltage power supply to centrally measure and determine an individual current consumption of each electrical load among said plurality of electrical loads associated with said machine module;
    providing a predetermined range of high and low current consumption limits for each of said plurality of electrical loads stored as a Non-Volatile Memory (NVM) table;
    comparing said current consumption of one of said plurality of electrical loads against said predetermined range of high and low current consumption limits for said one of said plurality of electrical loads to determine if said current consumption falls outside of said predetermined range of high and low current consumption limits in order to identify said at least one electrical load among said plurality of electrical loads requiring a subsequent repair; and
    inserting a plurality of precision resistors in series with at least one output of said low voltage power supply such that when said plurality of field effect transistors are turned ON said plurality of precision resistors are shorted in order to place the machine module in normal operation mode.

10. The method of claim 9 further comprising scaling a current into a voltage signal via said low voltage power supply utilizing at least one differential amplifier electrically in communication with said low voltage power supply.

11. The method of claim 9 further comprising transmitting said voltage signal to said control board of said machine module for a measurement thereof.

12. The method of claim 9 utilizing an electronic signature analysis with respect to said low voltage power supply to monitor current centrally prior to splitting and exiting said current from said low voltage power supply and electrically transmitted said current to a plurality of external connectors associated with said plurality of electrical loads within said machine module, wherein said low voltage power supply automatically detects an unplugged and/or a faulty wire harness associated with said plurality of electrical loads.

13. A system for incorporating electronic signature analysis in a low voltage power supply, comprising:
  a differential amplifier for scaling a current into a voltage signal with a range of 0-20V;
  a machine module having at least one electrical load and a module control board configured to divide said voltage signal into signals with a range of 0-5V;
  a low voltage power supply that centrally measures and determines a current consumption of each electrical load associated with said machine module wherein said low voltage power supply is placed in test mode by setting a plurality of input parameters equal to 1 utilizing said module control board, wherein a plurality of field effect transistors (FETs) are turned OFF during said test mode;
  a decoder for decoding said plurality of input parameters;
  a stored Non-Volatile Memory (NVM) table of high and low limits of current consumption for each said electrical load;
  a mechanism for comparing said current consumption against said NVM table of high and low current consumption limits for each electrical load to determine if said current consumption falls outside of said range of high and low current consumption limits in order to identify at least one electrical load among said plurality of loads requiring a subsequent repair; and
  a plurality of precision resistors in series with at least one output of said low voltage power supply such that when said plurality of field effect transistors are turned ON said plurality of precision resistors are shorted in order to place the machine module in normal operation mode.

14. The system of claim 13 further comprising:
  an automatic test routine for initially individually measuring and scaling a current into a voltage signal utilizing said automatic test routine running on a control board of said machine module associated with said low voltage power supply in order to utilize said low voltage power supply to centrally measure and determine said current consumption of said at least one electrical load.

15. The system of claim 14 further comprising at least one differential amplifier electrically in communication with said low voltage power supply, wherein said current is capable of being scaled into a voltage signal via said low voltage power supply utilizing said at least one differential amplifier electrically in communication with said low voltage power supply.

16. The system of claim 14 wherein said voltage signal is capable of being transmitted to said control board of said machine module for a measurement thereof.

17. The system of claim 16 further comprising:
  a current sensing device in series with at least one output of said low voltage power supply in order to shift said low voltage power supply between an automatic test mode and a normal operation mode by changing a state of at least one input parameter associated with said low voltage power supply utilizing said control board of said machine module.

18. The system of claim 13 further comprising a mechanism for performing an electronic signature analysis with respect to said low voltage power supply to monitor current centrally prior to splitting and exiting said current from said low voltage power supply and electrically transmitted said current to a plurality of external connectors associated with said plurality of electrical loads within said machine module.

* * * * *